(12) United States Patent
Cosand (10) Patent No.: US 7,701,375 B1
(45) Date of Patent: Apr. 20, 2010

(54) CURRENT STEERING SERIES-GATED QUANTIZER ENCODER AND ENCODING METHOD

(75) Inventor: Albert E. Cosand, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/261,828

(22) Filed: Oct. 30, 2008

(51) Int. Cl.
*H03M 1/12* (2006.01)

(52) U.S. Cl. ...................................... 341/155; 341/159

(58) Field of Classification Search ................. 341/155, 341/156, 136, 161, 118, 159, 160; 326/115, 326/93
See application file for complete search history.

(56) References Cited

U.S. PATENT DOCUMENTS

| | | | |
|---|---|---|---|
| 5,055,847 A * | 10/1991 | Rybicki et al. | 341/162 |
| 6,518,906 B2 * | 2/2003 | Abel et al. | 341/144 |
| 7,009,547 B2 * | 3/2006 | Guo et al. | 341/156 |
| 7,209,069 B2 * | 4/2007 | Felder | 341/163 |

OTHER PUBLICATIONS

Behzad, Razavi, "Principles of Data Conversion System Design," IEEE Press, New York, pp. 101-116 (includes section 6.3.8), 1995.
C.S. Choy in "Minimisation technique for series-gated emitter-coupled logic," IEEE Proceedings, vol. 136, Pt. G, No. 3, pp. 105-113, Jun. 1989.

* cited by examiner

*Primary Examiner*—Brian Young
(74) *Attorney, Agent, or Firm*—Ladas & Parry (57) ABSTRACT

An encoder for encoding comparator outputs of a bank of 2N−1 comparators into an N bit binary code is provided. The comparator outputs have redundancy so that if comparator output Cw is a binary zero, then each comparator output numbered Cx wherein x is greater than w, is binary zero, and if comparator output Cy is binary one, then each comparator output numbered Cz wherein z is less than y, is binary one. The encoder for encoding an Mth bit of the N bit binary code includes N−M+1 levels of current steering switches. The Lth level has 2(L−1) current steering switches each connected to a current steering switch in an (L−1)th level, except when the Lth level is 1. The comparator outputs are connected to the current steering switches.

23 Claims, 12 Drawing Sheets

FIG. 1

| COMPARATOR OUTPUTS | | | | | | | GRAY | | | BINARY | | |
|---|---|---|---|---|---|---|---|---|---|---|---|---|
| C1 | C2 | C3 | C4 | C5 | C6 | C7 | G3 | G2 | G1 | B3 | B2 | B1 |
| 1 | 1 | 1 | 1 | 1 | 1 | 1 | 1 | 0 | 0 | 1 | 1 | 1 |
| 1 | 1 | 1 | 1 | 1 | 1 | 0 | 1 | 0 | 1 | 1 | 1 | 0 |
| 1 | 1 | 1 | 1 | 1 | 0 | 0 | 1 | 1 | 1 | 1 | 0 | 1 |
| 1 | 1 | 1 | 1 | 0 | 0 | 0 | 1 | 1 | 0 | 1 | 0 | 0 |
| 1 | 1 | 1 | 0 | 0 | 0 | 0 | 0 | 1 | 0 | 0 | 1 | 1 |
| 1 | 1 | 0 | 0 | 0 | 0 | 0 | 0 | 1 | 1 | 0 | 1 | 0 |
| 1 | 0 | 0 | 0 | 0 | 0 | 0 | 0 | 0 | 1 | 0 | 0 | 1 |
| 0 | 0 | 0 | 0 | 0 | 0 | 0 | 0 | 0 | 0 | 0 | 0 | 0 |

PROVIDING COMPARATOR OUTPUTS OF A BANK OF 2N - 1 COMPARATORS, EACH COMPARATOR HAVING A THRESHOLD FOR COMPARING TO AN ANALOG INPUT AND A COMPARATOR OUTPUT, THE THRESHOLD OF EACH COMPARATOR ARRANGED SO THAT IF COMPARATOR OUTPUT CW, WHERE W RANGES FROM 1 TO 2N - 1, IS A BINARY ZERO, THEN EACH COMPARATOR OUTPUT NUMBERED CX WHERE X IS GREATER THAN W, IS BINARY ZERO, AND THE THRESHOLD OF EACH COMPARATOR ARRANGED SO THAT IF COMPARATOR OUTPUT CY, WHERE Y RANGES FROM 1 TO 2**N - 1, IS BINARY ONE, THEN EACH COMPARATOR OUTPUT NUMBERED CZ WHERE Z IS LESS THAN Y, IS BINARY ONE              100

PROVIDING N CIRCUITS, EACH OF THE N CIRCUITS FOR ENCODING A RESPECTIVE BIT OF THE N BIT BINARY CODE, THE CIRCUIT FOR ENCODING THE MTH BIT, WHEREIN M RANGES FROM 1 TO N INCLUDING N-M+1 LEVELS OF CURRENT STEERING SWITCHES, WHEREIN AN LTH LEVEL OF THE 1 TO N-M+1 LEVELS HAS 2**(L-1) CURRENT STEERING SWITCHES EACH CONNECTED TO A CURRENT STEERING SWITCH IN AN (L-1)TH LEVEL, UNLESS THE LTH LEVEL IS 1              102

CONNECTING THE COMPARATOR OUTPUTS OF THE BANK OF 2**N - 1 COMPARATORS TO THE CURRENT STEERING SWITCHES              104

FIG. 11

PROVIDING COMPARATOR OUTPUTS OF A BANK OF 2N - 1 COMPARATORS, EACH COMPARATOR HAVING A THRESHOLD FOR COMPARING TO AN ANALOG INPUT AND A COMPARATOR OUTPUT, THE THRESHOLD OF EACH COMPARATOR ARRANGED SO THAT IF COMPARATOR OUTPUT CW, WHERE W RANGES FROM 1 TO 2N - 1, IS A BINARY ZERO, THEN EACH COMPARATOR OUTPUT NUMBERED CX WHERE X IS GREATER THAN W, IS BINARY ZERO, AND THE THRESHOLD OF EACH COMPARATOR ARRANGED SO THAT IF COMPARATOR OUTPUT CY, WHERE Y RANGES FROM 1 TO 2**N - 1, IS BINARY ONE, THEN EACH COMPARATOR OUTPUT NUMBERED CZ WHERE Z IS LESS THAN Y, IS BINARY ONE      200

PROVIDING N CIRCUITS, EACH OF THE N CIRCUITS FOR ENCODING A RESPECTIVE BIT OF THE N BIT GRAY CODE, THE CIRCUIT FOR ENCODING THE MTH BIT, WHEREIN M RANGES FROM 1 TO N, COMPRISING N-M+1 LEVELS OF CURRENT STEERING SWITCHES, WHEREIN THE NTH LEVEL HAS ONE CURRENT STEERING SWITCH CONNECTED TO A CURRENT STEERING SWITCH IN AN (L-1)TH LEVEL AND WHEREIN AN LTH LEVEL OF THE 1 TO N-1 LEVELS HAS 2**(L-1) CURRENT STEERING SWITCHES EACH CONNECTED TO A CURRENT STEERING SWITCH IN AN (L-1)TH LEVEL, UNLESS THE LTH LEVEL IS 1      202

CONNECTING THE COMPARATOR OUTPUTS OF THE BANK OF 2**N - 1 COMPARATORS TO THE CURRENT STEERING SWITCHES      204

FIG. 12

CURRENT STEERING SERIES-GATED QUANTIZER ENCODER AND ENCODING METHOD

FIELD

This disclosure relates to quantizer encoders, and in particular to binary and gray code encoders.

BACKGROUND

Most high speed analog to digital converter (ADC) architectures have a bank of comparators that have thresholds spaced over the range of the analog signal to be converted. The outputs of a bank of comparators are ideally all ones for those comparators which have thresholds below the current value of the analog input and all zeroes for those with thresholds above the analog input, as discussed in Behzad Razavi, *Principles of Data Conversion System Design*, pp. 101-116, IEEE Press, New York (1995). After the bank of comparators, an encoder is commonly used to encode the output of the comparators into a code, such as a binary or gray code. One class of prior art encoders uses either a ROM structure or a collection of logic gates to encode the comparator outputs to a desired code.

There can be either static or dynamic errors in the thresholds of the comparators such that there is not always a single well defined transition from all ones to all zeros, so a relatively complex gate structure with three or more inputs is generally needed to ensure a suitably high probability of encoding the proper code from the comparator outputs. This in turn means either that each comparator output has a fanout of three or more, or that a cascaded gate structure is needed. Neither of these is desirable for high speed and low power. Other approaches include a cascade of exclusive-or gates, or an adder tree that simply sums the number of comparators with high outputs. Both of these approaches also involve a relatively high number of gates and high power dissipation.

Figure 1:
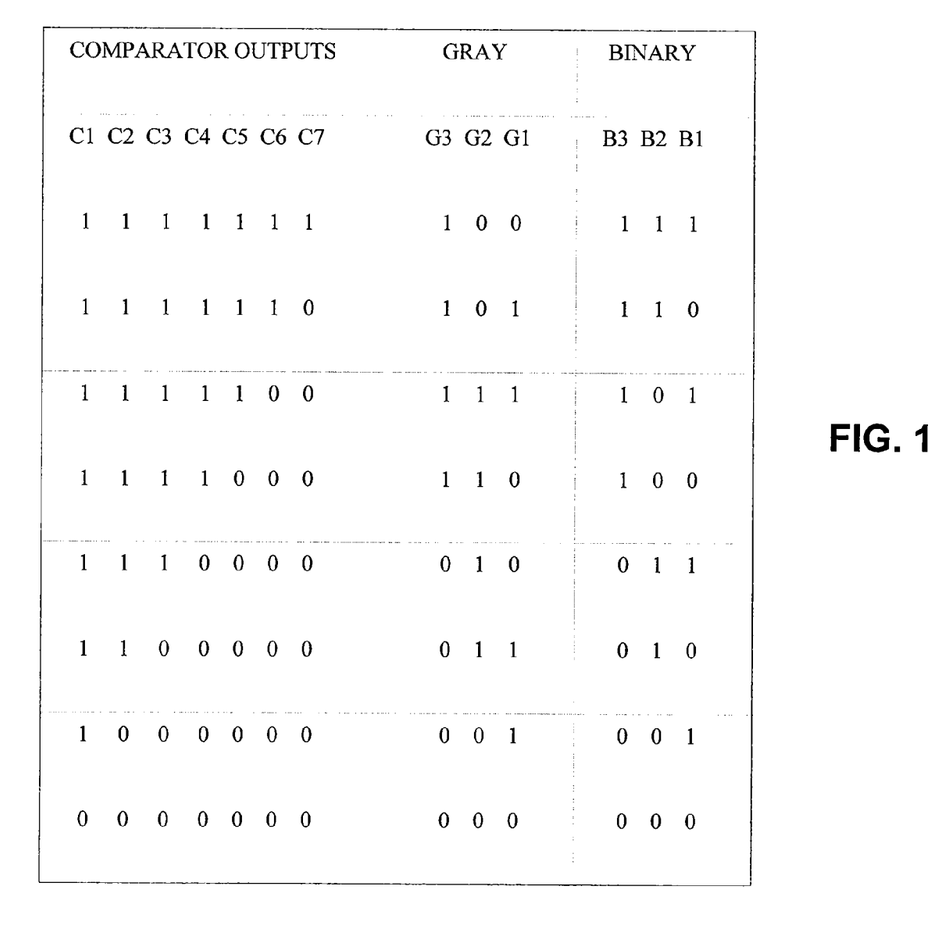
FIG. 1 is a table showing comparator outputs and gray and binary encoding of the comparator outputs in accordance with the prior art.

FIG. 1 shows the encoding of a bank of 7 comparator outputs C1 to C7 into a 3 bit gray code (G3, G2 and G1) or a 3 bit binary code (B3, B2 and B1). The 7 comparator outputs are selected so that if comparator output Cw, wherein w ranges from 1 to 2**\*\*N−1 and wherein N is the number of bits in the encoded code, is a binary zero, then each comparator output numbered Cx wherein x is greater than w, is binary zero. The thresholds of each comparator are also selected so that if comparator output Cy, wherein y ranges from 1 to 2\*\*N−1 and wherein N is the number of bits in the encoded code, is binary one, then each comparator output numbered Cz wherein z is less than y, is binary one. For example, in FIG. 1 when comparator output C4 is binary 0, then comparator outputs C5 through C7 are also binary zero. When comparator output C4 is binary 1, then comparator outputs C1 through C3** are also binary one.

The comparator outputs C1 to C7 may be encoded into a 3-bit gray code or a 3-bit binary code by using logic. Using the notation that the complement of a signal "A" is "AX" (not A=AX), the logic equations for the encoders can be implemented with the following logic.

For the binary code the encoding logic by inspection from FIG. 1 is:

$B1 = C1*C2X + C3*C4X + C5*C6X + C7$ $B2 = C2*C4X + C6$ $B3 = C4.$

For the gray code the encoding logic by inspection from FIG. 1 is:

$G1 = C1*C3X + C5*C7X$ $G2 = C2*C6X$ $G3 = C4.$

Figure 2:
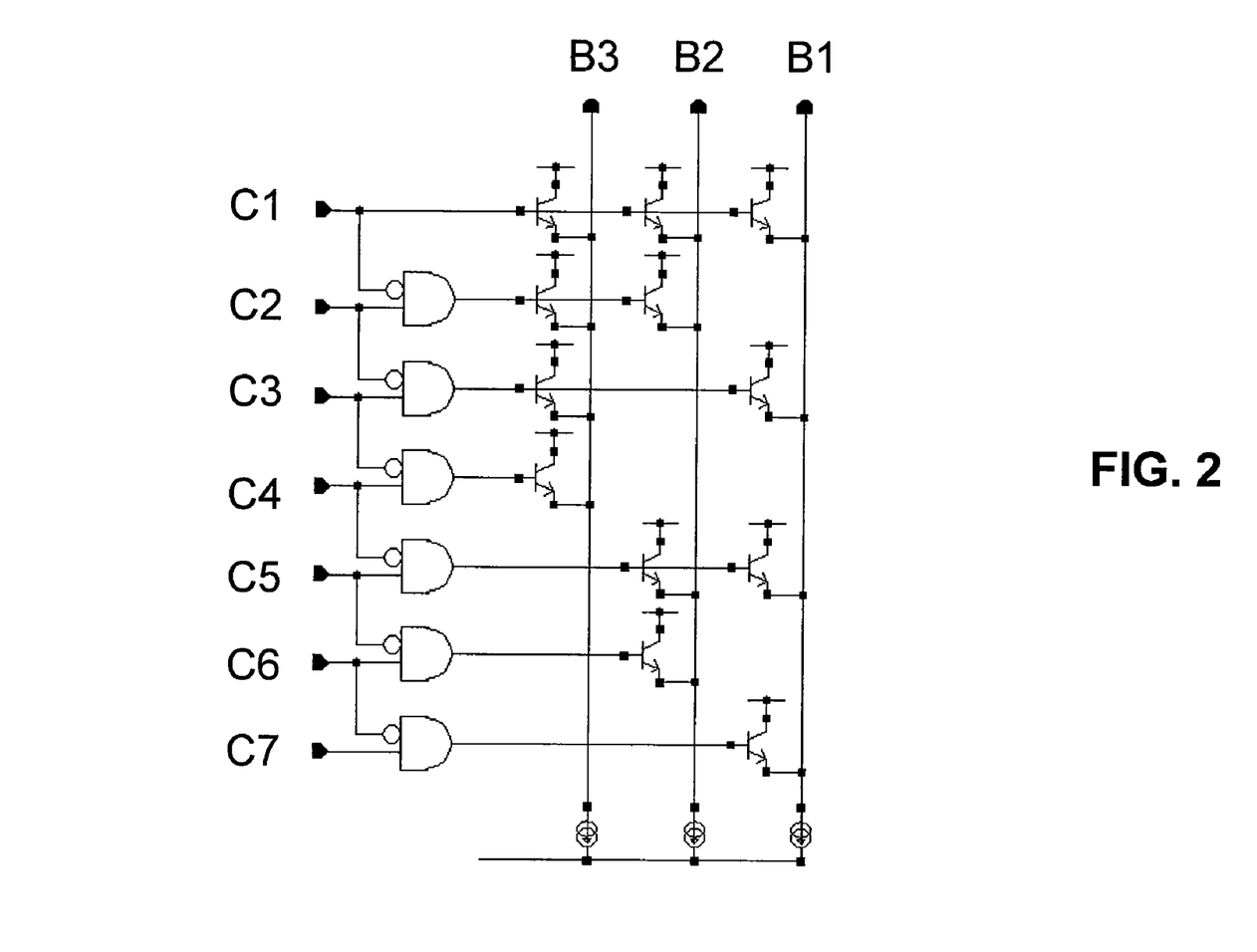
FIG. 2 shows a binary encoding of comparator outputs in accordance with the prior art.

FIG. 2 shows one example of a prior art binary encoder for implementing the logic for B1, B2 and B3. This prior art encoder has a relatively complex gate structure and has a cascaded gate structure, which is not desirable for high speed and low power.

Differential current-steering series-gated logic circuitry is recognized as one of the faster types of circuitry for implementing logic functions. It is commonly implemented with either bipolar or FET integrated circuits. A basic circuit for a design is a binary current steering tree, made of one differential pair or more generally, a binary current steering switch on the bottom level, connected to two differential pairs on the second level. The two differential pairs are in turn connected to four differential pairs on the third level, and so on to form an N level current steering circuit with $2^{N-1}$ differential pairs on the N-th level.

C. S. Choy in "Minimization technique for series-gated emitter-coupled logic", IEEE Proceedings, Vol. 136, Pt. G, No. 3, June 1989, describes a technique for deriving an optimized multi-level current steering gate for differential logic given logic equations or a truth table, the contents of which are incorporated by reference.

What is needed are encoders and methods of making encoders that have high speed and low power. The embodiments of the present disclosure answer these and other needs.

SUMMARY

In a first embodiment disclosed herein, a encoder for encoding comparator outputs of a bank of 2**\*\*N−1 comparators into an N bit binary code, each comparator having a threshold for comparing to an analog input and a comparator output, the threshold of each comparator selected so that if comparator output Cw, wherein w ranges from 1 to 2\*\*N−1, is a binary zero, then each comparator output numbered Cx wherein x is greater than w, is binary zero, and the threshold of each comparator selected so that if comparator output Cy, wherein y ranges from 1 to 2\*\*N−1, is binary one, then each comparator output numbered Cz wherein z is less than y, is binary one, comprises N circuits, each of the N circuits for encoding an Mth bit, wherein M ranges from 1 to N, of the N bit binary code, the circuit for the Mth bit comprising N−M+1 levels of current steering switches; wherein an Lth level of the 1 to N−M+1 levels has 2\*\*(L−1) current steering switches each connected to a current steering switch in an (L−1)th level, except when the Lth level is 1; and wherein the comparator outputs of the bank of 2\*\***N−1 comparators are connected to the current steering switches.

In another embodiment disclosed herein, an encoder for encoding comparator outputs of a bank of 2**\*\*N−1 comparators into an N bit gray code, each comparator having a threshold for comparing to an analog input and a comparator output, the threshold of each comparator selected so that if comparator output Cw, wherein w ranges from 1 to 2\*\*N−1, is a binary zero, then each comparator output numbered Cx wherein x is greater than w, is binary zero, and the threshold of each comparator selected so that if comparator output Cy, wherein y ranges from 1 to 2\*\*N−1, is binary one, then each comparator output numbered Cz wherein z is less than y, is binary one, comprises N circuits, each of the N circuits for encoding an Mth bit, wherein M ranges from 1 to N, of the N bit gray code; the circuit for the Mth bit comprising N−M+1 levels of current steering switches; wherein the Nth level has one current steering switch connected to a current steering switch in an (L−1)th level; and wherein an Lth level of the 1 to N−1 levels has 2(L−1) current steering switches each connected to a current steering switch in an (L−1)th level, except when the Lth level is 1; and wherein the comparator outputs of the bank of 2**N−1 comparators are connected to the current steering switches.

In yet another embodiment disclosed herein, a method of encoding comparator output of an analog to digital converter into an N bit binary code comprises providing comparator outputs of a bank of 2N−1 comparators, each comparator having a threshold for comparing to an analog input and a comparator output, the threshold of each comparator selected so that if comparator output Cw, wherein w ranges from 1 to 2N−1, is a binary zero, then each comparator output numbered Cx wherein x is greater than w, is binary zero, and the threshold of each comparator selected so that if comparator output Cy, wherein y ranges from 1 to 2N−1, is binary one, then each comparator output numbered Cz wherein z is less than y, is binary one; providing N circuits, each of the N circuits for encoding a respective bit of the N bit binary code, the circuit for encoding the Mth bit, wherein M ranges from 1 to N, comprising: N−M+1 levels of current steering switches; wherein an Lth level of the 1 to N−M+1 levels has 2(L−1) current steering switches each connected to a current steering switch in an (L−1)th level, except when the Lth level is 1; and connecting the comparator outputs of the bank of 2**N−1 comparators to the current steering switches.

In yet another embodiment disclosed herein, a method of encoding comparator output of an analog to digital converter into an N bit Gray code comprises providing comparator outputs of a bank of 2N−1 comparators, each comparator having a threshold for comparing to an analog input and a comparator output, the threshold of each comparator selected so that if comparator output Cw, wherein w ranges from 1 to 2N−1, is a binary zero, then each comparator output numbered Cx wherein x is greater than w, is binary zero, and the threshold of each comparator selected so that if comparator output Cy, wherein y ranges from 1 to 2N−1, is binary one, then each comparator output numbered Cz wherein z is less than y, is binary one; providing N circuits, each of the N circuits for encoding a respective bit of the N bit Gray code, the circuit for encoding the Mth bit, wherein M ranges from 1 to N, comprising N−M+1 levels of current steering switches; wherein the Nth level has one current steering switch connected to a current steering switch in an (L−1)th level; and wherein an Lth level of the 1 to N−1 levels has 2(L−1) current steering switches each connected to a current steering switch in an (L−1)th level, except when the Lth level is 1; and connecting the comparator outputs of the bank of 2**N−1 comparators to the current steering switches.

These and other features and advantages will become further apparent from the detailed description and accompanying figures that follow. In the figures and description, numerals indicate the various features, like numerals referring to like features throughout both the drawings and the description.

DETAILED DESCRIPTION

Figure 3:
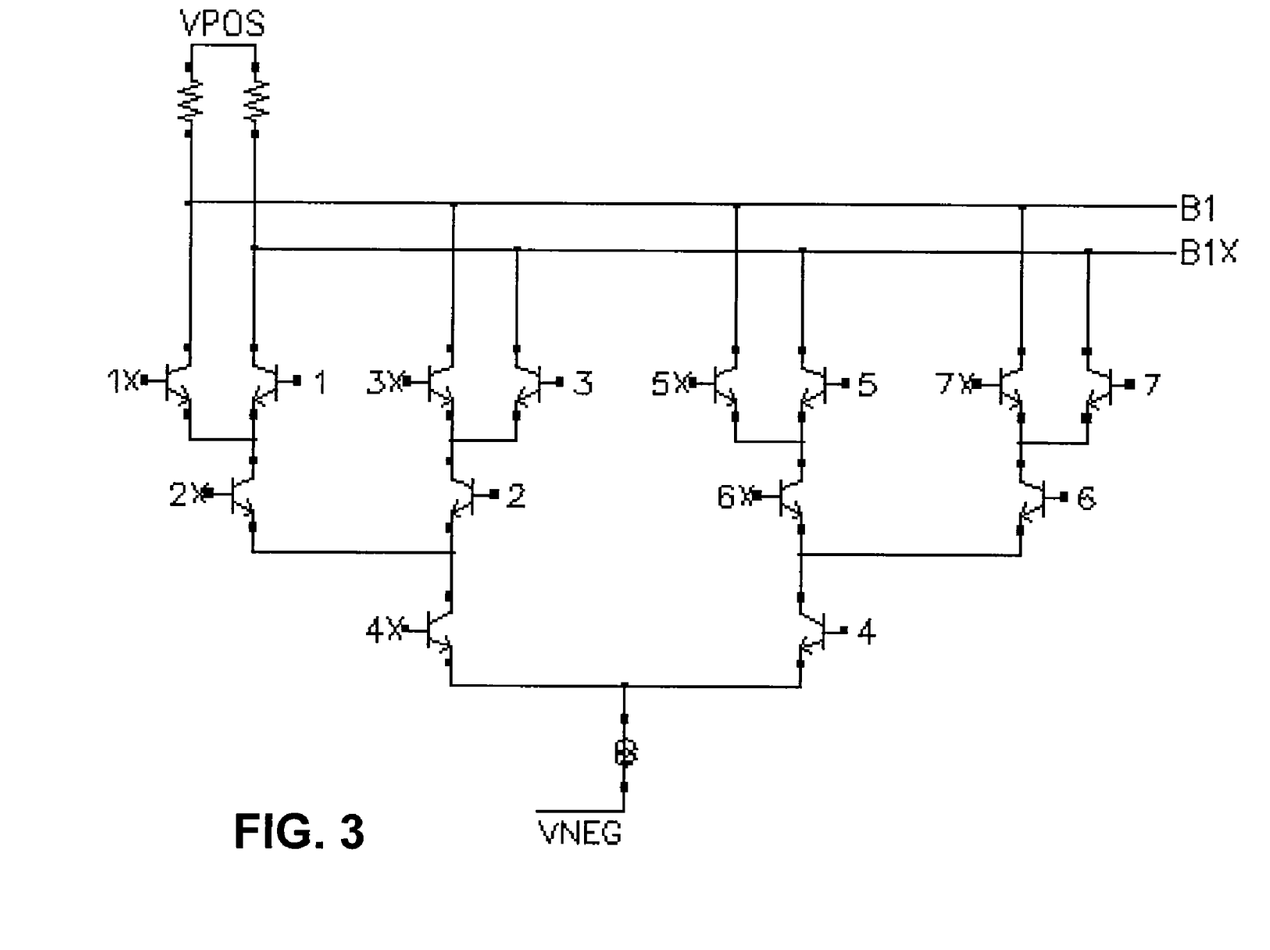
FIG. 3 is a binary encoder of comparator outputs using current steering logic for the least significant bit of a 3 bit binary code in accordance with the present disclosure.

Referring to FIG. 3 an exemplary embodiment of a binary encoder of comparator outputs is shown using current steering circuit 10 for the least significant bit of a 3 bit binary code in accordance with the present disclosure. In FIG. 3 the comparator outputs are shown as inputs to the encoder. For example, comparator output 1 connected to the base of transistor 11 is the comparator output C1 in FIG. 1 and comparator output 1X is the complement of C1, comparator output 2 is the comparator output C2 in FIG. 1 and comparator output 2X is the complement of C2 and so on. This notation for the comparator outputs is used throughout the present disclosure.

The logic equation for the current steering circuit 10 embodied by the circuit shown in FIG. 3 is B1=1*2X*4X+2*3*4X+4*5*6X+4*6*7, wherein * is the logic AND function and + is the logic OR function. This logic is obtained by observing that when B1X is a binary 0 or low, then B1 is a binary 1 or high. B1X is low whenever 1*2X*4X OR 2*3*4X OR 4*5*6X OR 4*6*7 are binary 1 or high.

The current steering logic circuit may be comprised of differential pairs and each differential pair has two transistors. For example, in FIG. 3 transistors 20 and 30 make up one differential pair. The transistors each have a base 22, a collector 24 and an emitter 26. The comparator outputs are connected to the bases of the transistors. For example, comparator output 4 is connected to the base of transistor 20. When comparator output 4 is high then current flows from the collector to the base. If comparator outputs 6 and 7 are also high then current flows through transistors 34, 32 and 20 from VPOS 12 to VNEG 14 and B1X is low or a binary 0, which in turn indicates that B1 is high or binary 1.

In one embodiment of a current steering logic circuit, collectors are connected to the emitters of a differential pair in a higher level. The emitters of the transistors in the lowest level of the current steering logic circuit are connected to a current source 16. This connection forms a series gated current steering logic circuit. For example, in FIG. 3, transistors 34, 32 and 20 implement series-gated current steering.

In the present invention, the characteristics of current steering logic circuits are matched to the redundancy contained in the comparator outputs. This provides a speed and power advantage over other encoding techniques. There is redundancy in the comparator outputs, because, as discussed above, and shown in FIG. 1, the thresholds of the comparator outputs are selected so that if comparator output Cw, wherein w ranges from 1 to 2N−1 and wherein N is the number of bits in the encoded code, is a binary zero, then each comparator output numbered Cx wherein x is greater than w, is binary zero, and the thresholds of each comparator are also selected so that if comparator output Cy, wherein y ranges from 1 to 2N−1 and wherein N is the number of bits in the encoded code, is binary one, then each comparator output numbered Cz wherein z is less than y, is binary one.

Thus, when 2X is high that implies that comparator output 2 is low, which from the preceding indicates that the comparator output 4 is also low, which implies 4X is high. Similarly when comparator output 3 is high the above indicates that comparator output 2 is high, when comparator output 5 is high the above comparator output redundancy indicates that comparator output 4 is high, and when comparator output 7 is high the above comparator output redundancy indicates that comparator outputs 6 and 4 are high. Thus the logic equation for the current steering circuit of FIG. 3, B1=1*2X*4X+2*3*4X+4*5*6X+4*6*7 is equivalent to the standard form for B1, which is B1=C1*C2X+C3*C4X+C5*C6X+C7 or equivalently B1=1*2X+3*4X+5*6X+7.

Figure 4:
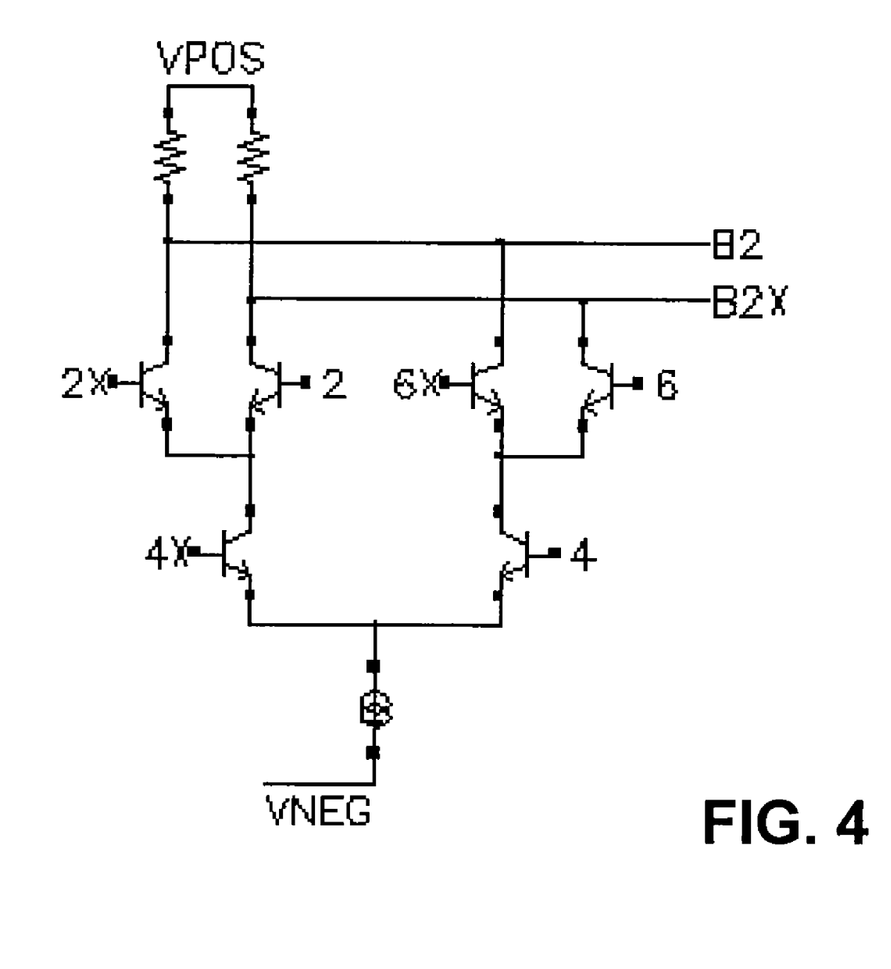
FIG. 4 is a binary encoder of comparator outputs using current steering logic for the second least significant bit of a 3 bit binary code in accordance with the present disclosure.

FIG. 4 shows an exemplary embodiment of a binary encoder of comparator outputs using current steering circuit 40 for the second least significant bit of a 3 bit binary code in accordance with the present disclosure. The logic equation for the current steering circuit 40 of FIG. 4 using the notation described above is B1=2*4X+4*6. This logic is obtained by observing that when B2X is a binary 0 or low, then B1 is a binary 1 or high. B2X is low whenever 2*4X or 4*6 is binary 1 or high. Also, because of the redundancy in the comparator outputs, when comparator output 6 is high then the comparator redundancy indicates that comparator output 4 is high. Thus the logic equation for the current steering circuit B2=2*4X+4*6 is equivalent to the standard form for B2, which is B2=C2*C4X+C6 or equivalently B2=2*4X+6.

Figure 5:
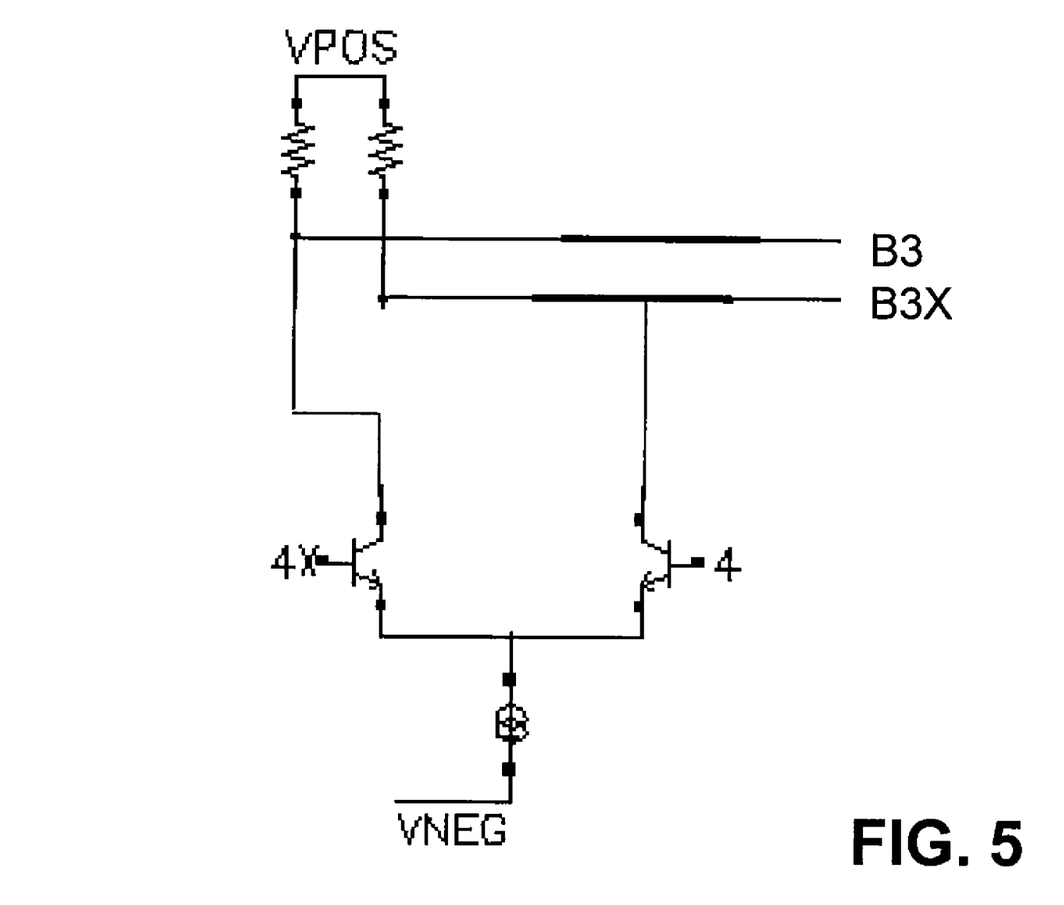
FIG. 5 is a binary encoder of comparator outputs using current steering logic for the most significant bit of a 3 bit binary code in accordance with the present disclosure.

FIG. 5 shows an exemplary embodiment of a binary encoder using current steering circuit 44 for the most significant bit of a 3 bit binary code in accordance with the present disclosure. The logic equation for the current steering circuit 44 using the notation described above is B3=4. This logic is obtained by observing that when B3X is a binary 0 or low, then B3 is a binary 1 or high. B3X is low whenever 4 is a binary 1 or high. Thus the logic equation for the current steering circuit B3=4 is equivalent to the standard form for B3, which is B3=C4 or equivalently B3=4.

This approach may be extended to any N-bit quantizer with $2^N-1$ comparators. The B1 encoder may be formed with an N level current steering circuit, the B2 encoder may be formed with an N−1 level current steering circuit, the B3 encoder may be formed with an N−2 level current steering circuit, and so on.

For the general case of a direct encode of a quantizer to N binary bits, the current steering circuit for the LSB encoder may be formed with an N-level current-steering circuit with one differential pair in the lowest level or $1^{st}$ level, two differential pairs in the $2^{nd}$ level, four differential pairs in the $3^{rd}$ level, and so on, doubling the number of differential pairs in each successive level. The inputs to the differential pairs are driven from the comparator outputs as shown in FIG. 1, with all odd numbered comparators driving the top level or Nth level. Comparator outputs whose numbers are twice an odd number drive the N−1 th level, those whose positions are four times an odd number drive the N−2 th, and so on. The first level has only one differential pair.

The encoder for the second least significant bit is the same circuit as for the least significant bit with the top level removed as can be seen by comparing FIGS. 3 and 4. Each higher order bit encoder is formed by removing the top row of differential pairs from the previous bit's encoder as can be seen by comparing FIGS. 4 and 5.

Using Gray encoding rather than binary encoding in the initial encoding has advantages of being more robust in the presence of either static or dynamic errors in the comparator thresholds (as shown in Behzad Razavi, *Principles of Data Conversion System Design*, Section 6.3.8, IEEE Press, New York (1995)).

Figure 6:
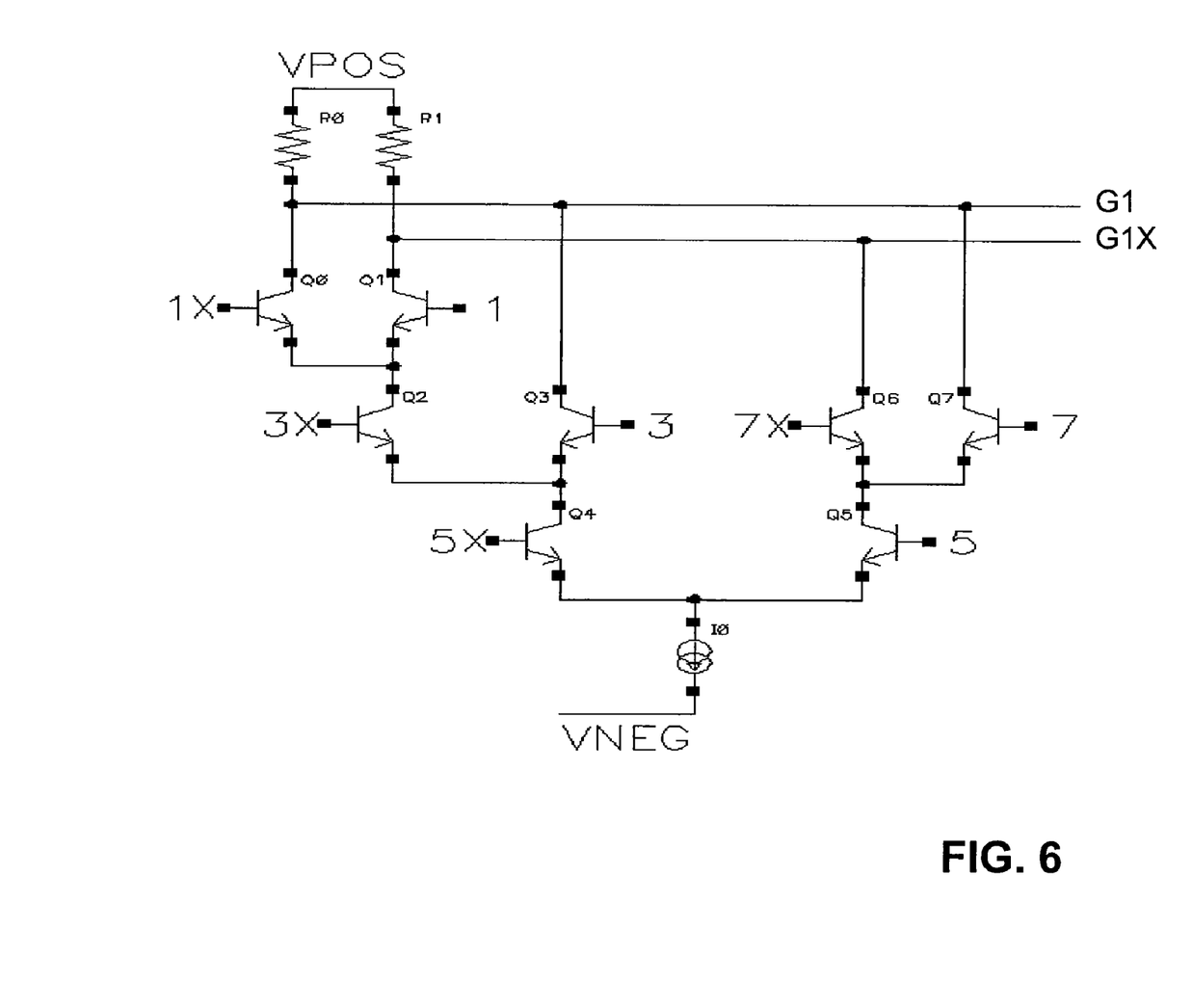
FIG. 6 is a gray encoder of comparator outputs using current steering logic for the least significant bit of a 3 bit gray code in accordance with the present disclosure.

Referring to FIG. 6, an exemplary embodiment of a Gray encoder of comparator outputs is shown using current steering circuit 50 for the least significant bit of a 3 bit Gray code in accordance with the present disclosure. The logic equation for the current steering circuit 50 shown in FIG. 6 is G1=1*3X*5X+5*7X, wherein * is the logic AND function and + is the logic OR function. This logic is obtained by observing that when G1X is a binary 0 or low, then G1 is a binary 1 or high. G1X is low whenever 1*3X*5X OR 5*7X are binary 1 or high.

Because of the redundancy in the comparator outputs, as discussed above, when 3X is high that implies that comparator output 3 is low, which from the preceding indicates that the comparator output 5 is also low, which implies 5X is high. Thus the logic equation for the current steering circuit 50 G1=1*3X*5X+5*7X is equivalent to the standard form for G1, which is G1=C1*C3X+C5*C7X or equivalently G1=1*3X+5*7X.

Figure 7:
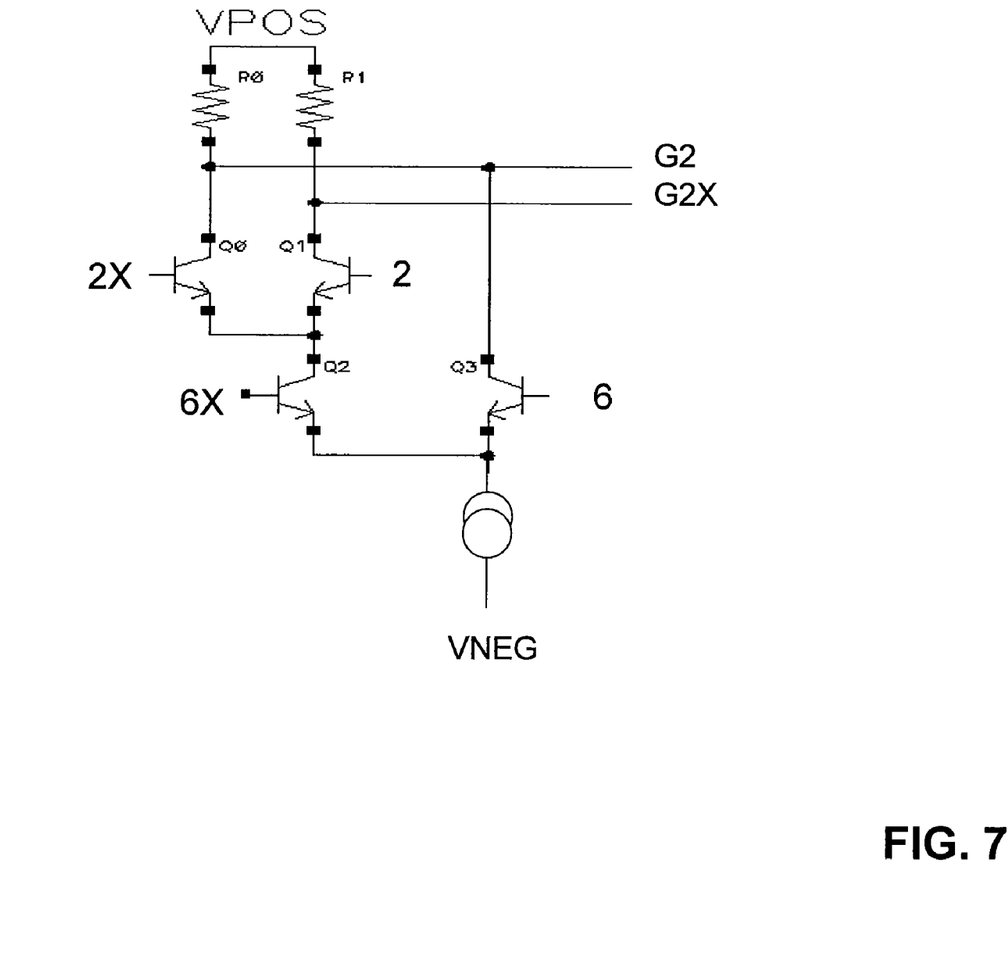
FIG. 7 is a gray encoder of comparator outputs using current steering logic for the second least significant bit of a 3 bit gray code in accordance with the present disclosure.

FIG. 7 shows an exemplary embodiment of a Gray encoder of comparator outputs using current steering circuit 54 for the second least significant bit of a 3 bit Gray code in accordance with the present disclosure. The logic equation for the current steering circuit 54 shown in FIG. 7 is G2=2*6X, wherein * is the logic AND function and + is the logic OR function. This logic is obtained by observing that when G2X is a binary 0 or low, then G2 is a binary 1 or high. G2X is low whenever 2*6X is binary 1 or high. The logic equation for the current steering circuit 54 G2=2*6X is equivalent to the standard form for G2, which is G2=C2*C6X or equivalently G2=2*6X.

Figure 8:
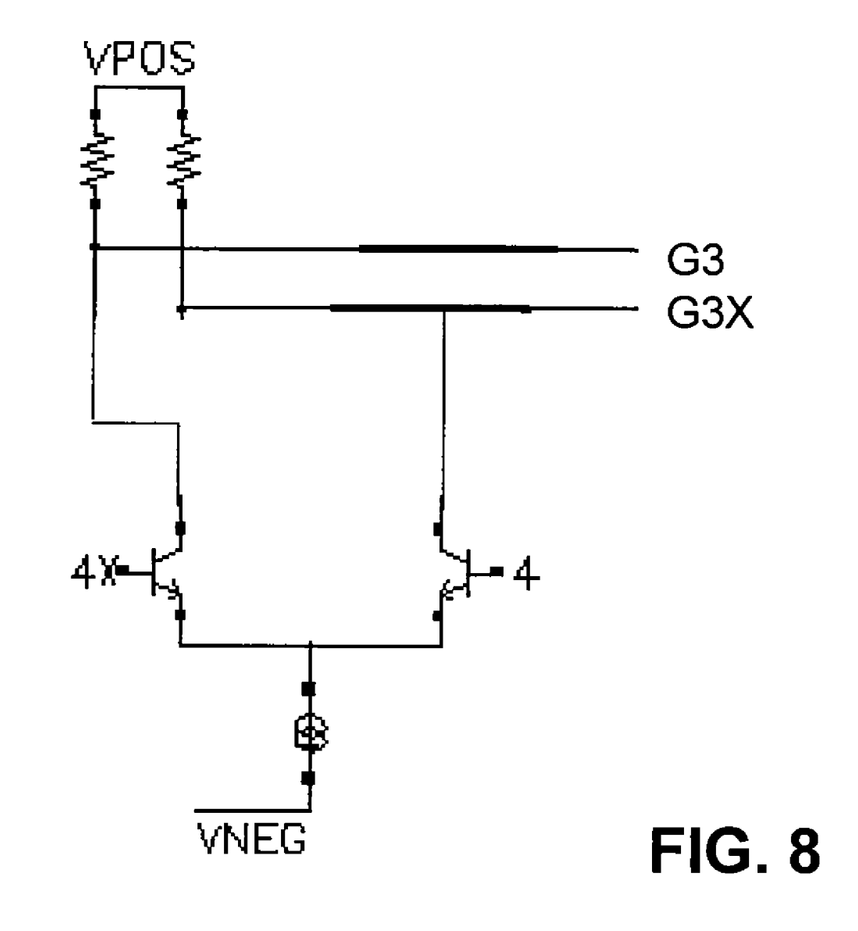
FIG. 8 is a gray encoder of comparator outputs using current steering logic for the most significant bit of a 3 bit gray code in accordance with the present disclosure.

FIG. 8 shows an exemplary embodiment of a Gray encoder of comparator outputs using current steering circuit 56 for the most significant bit of a 3 bit Gray code in accordance with the present disclosure. The logic equation for the current steering circuit 56 shown in FIG. 8 is G3=4. This logic is obtained by observing that when G3X is a binary 0 or low, then G3 is a binary 1 or high. G3X is low whenever 4 is binary 1 or high. The logic equation for the current steering circuit 56 G3=4 is equivalent to the standard form for G3, which is G3=C4 or equivalently G3=4.

Gray encoders may be extended to encode a larger number of bits. The logic for encoding $2^N-1$ comparator outputs, wherein N=4 into a 4-bit Gray code is in standard form:

$$G1=C1*C3X+C5*C7X+C9*C11X+C13*C15X$$

$$G2=C2*C6X+C10*C14X$$

$$G3=C4*C12X$$

$$G4=C8.$$

Figure 9:
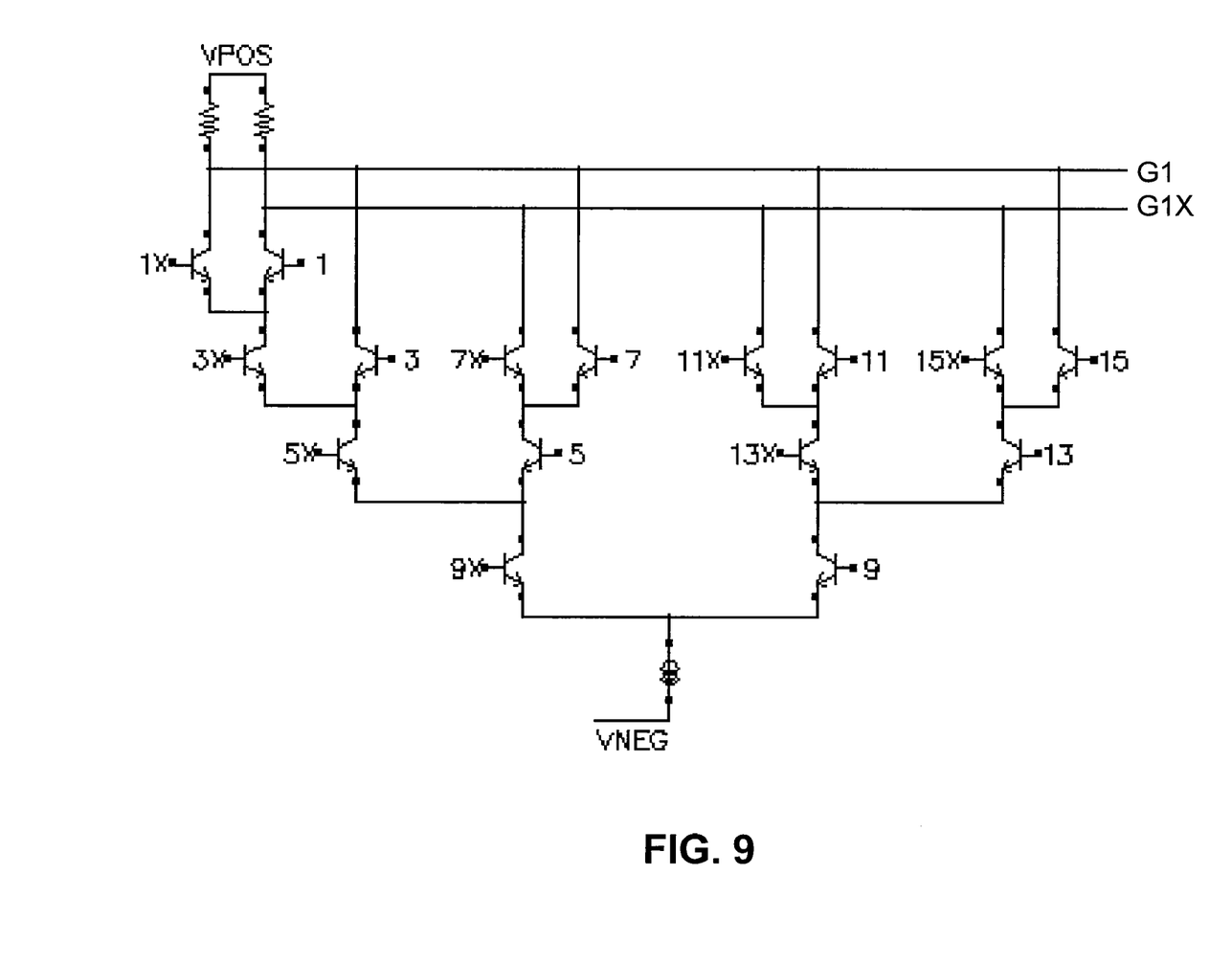
FIG. 9 is a gray encoder of comparator outputs using current steering logic for the least significant bit of a 4 bit gray code in accordance with the present disclosure.

FIG. 9 shows an exemplary embodiment of a Gray encoder of comparator outputs using current steering circuit 60 for the least significant bit of a 4 bit Gray code in accordance with the present disclosure. The logic equation for the current steering circuit 60 shown in FIG. 9 is $$G1=1*3X*5X*9X+5*7X*9X+9*11X*13X+9*13*15X.$$

Because of the redundancy in the comparator outputs, as discussed above, when 3X is high that implies that comparator output 3 is low, which from the preceding indicates that the comparator outputs 5 and 9 are also low, so 5X and 9X are high. Similarly, when 7X is high that implies that comparator output 7 is low, which from the comparator output redundancy indicates that the comparator output 9 is also low, so 9X is high. Similarly, when 7X is high that implies that comparator output 7 is low, which from the comparator output redundancy indicates that the comparator output 9 is also low, which 9X is high. Also, when 13 is high then the comparator output redundancy indicates that the comparator output 9 is also high. Thus the logic equation for the current steering circuit 60 G1=1*3X*5X*9X+5*7X*9X+9*11X*13X+9*13*15X is equivalent to the standard form for G1, which is G1=C1*C3X+C5*C7X+C9*C11X+C13*C15X or equivalently G1=1*3X+5*7X+9*11X+13*15X.

For the general case of a Gray encoder, the current steering circuit for the LSB encoder may be formed with an N-level current steering circuit for the least significant bit, an (N−1) level circuit for the next least significant bit, and so on. However, there is only one differential pair in the top level for a Gray code encoder.

For the least significant bit, the single differential pair in the top level is driven by comparator output 1. In the next level down, the differential pairs are driven by comparator outputs numbered [2(2k−1)+1] for k=1, 2, 3 . . . . The next level down is driven by comparators numbered [4(2m−1)+1] for m=1, 2, 3 . . . . The level below that is driven by numbers [8(2n−1)+1], and so on.

The encoder for the second least significant bit of the Gray code has the same structure as the least significant bit; however, there are only N−1 levels and the comparator output driving any given level and input to a transistor on the current steering circuit on a second least significant bit Gray encoder is twice the number of the comparator output that would drive that current steering circuit input if the second least significant bit of an N bit Gray encoder was the least significant bit of an N−1 bit Gray encoder.

Encoders for the more significant bits are obtained in a similar way and are derived from the least significant bit encoders of quantizers with successively smaller numbers of bits with an additional factor of two applied to the comparator outputs that drive the current steering inputs for each step up in significance of the bit.

It is sometimes desirable to limit the number of levels of series-gating in any current steering circuit, as for instance when it is necessary to limit the voltage headroom required for current mode logic (CML) or emitter coupled logic (ECL). The standard sorts of Boolean function manipulation can of course be applied to these encoders without changing their function.

Figure 10A:
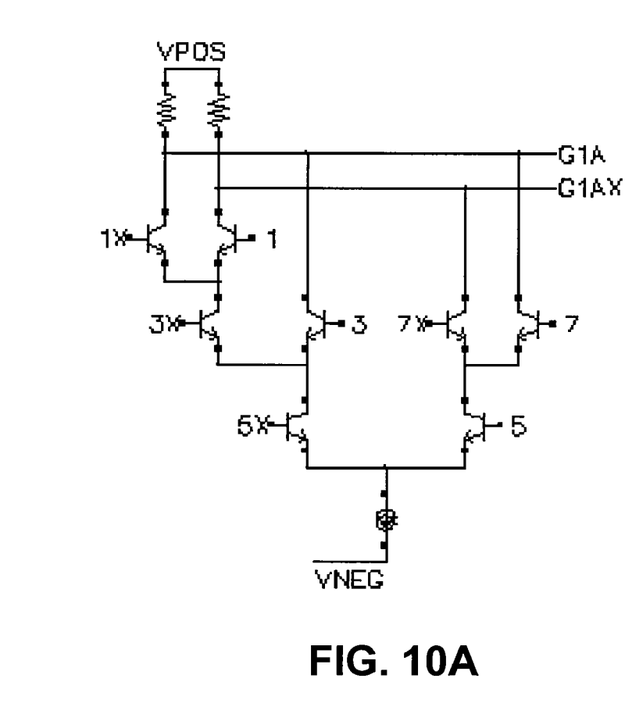
FIGS. 10A and 10B shows a decomposition of a four level current steering logic circuit for the gray encoder as shown in FIG. 9 to a cascade of two three level current steering logic circuits to implement the gray encoder.
Figure 10B:
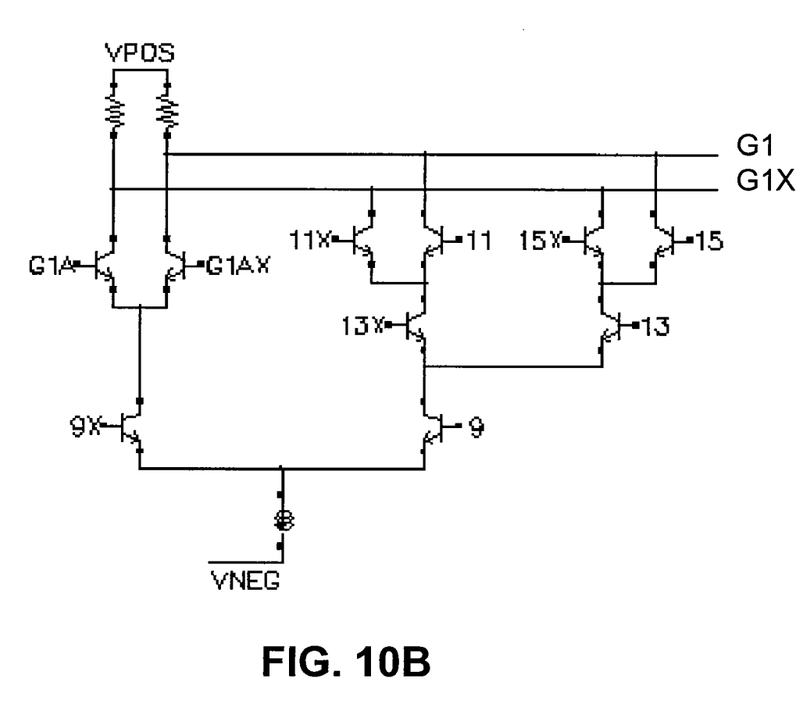

FIGS. 10A and 10B illustrate an example of the 4 level current steering circuit 60 of FIG. 9 reduced to two 3 level current steering circuits 70 and 72. The current steering circuit 70 in FIG. 10A generates the function G1A=1*3X*5X+5*7X. The current steering circuit 72 in FIG. 10B generates the function G1=G1A*9X+9*11X*13X+9*13*15X, which is the same as G1=(1*3X*5X+5*7X)*9X+9*11X*13X+ 9*13*15X. This is the same as the logic equation for the current steering circuit 60 G1=1*3X*5X*9X+5*7X*9X+ 9*11X*13X+9*13*15X.

Figure 11:
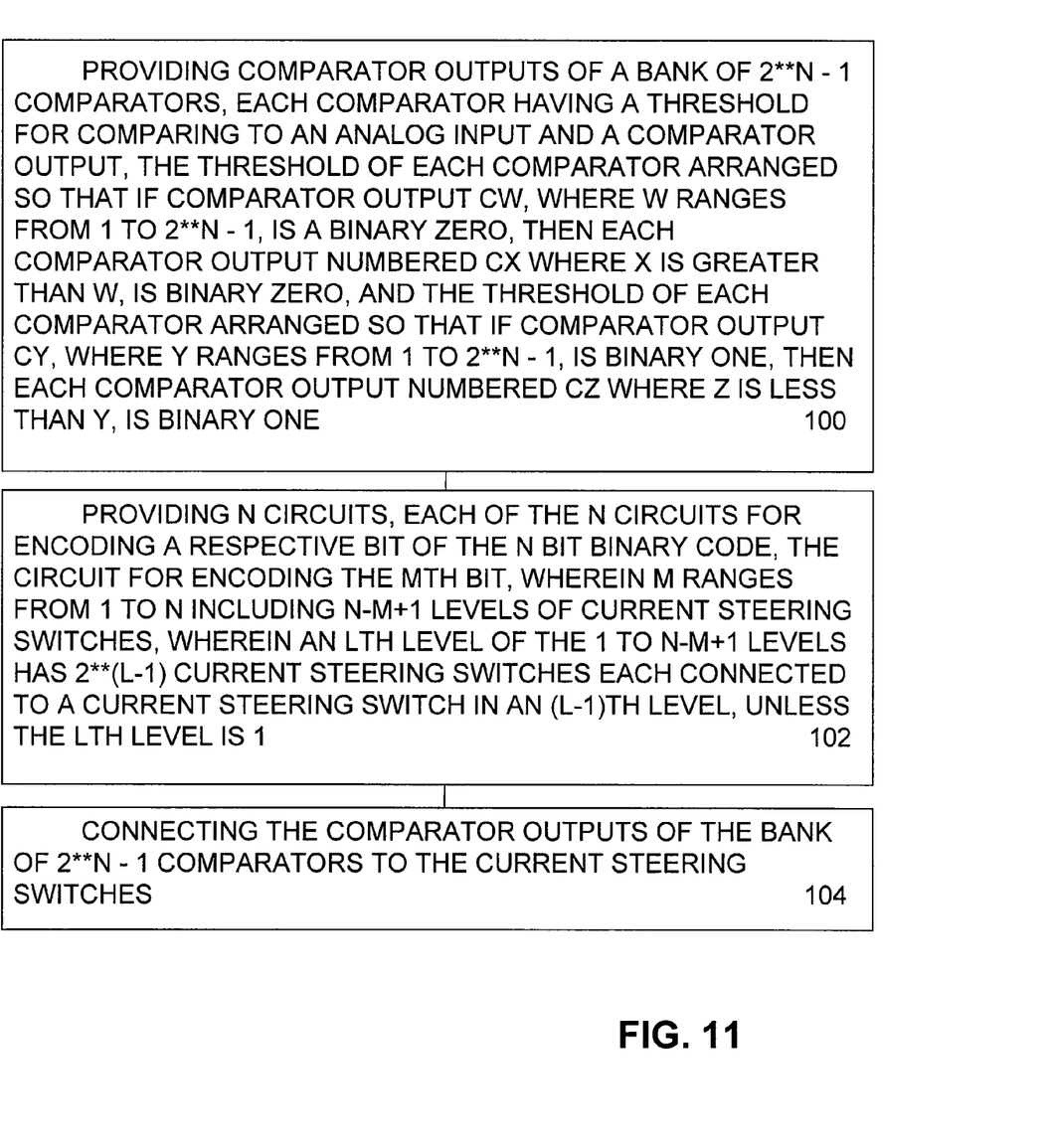
FIGS. 11 and 12 show methods for encoding comparator outputs into a binary code and a gray code, respectively.
Figure 12:
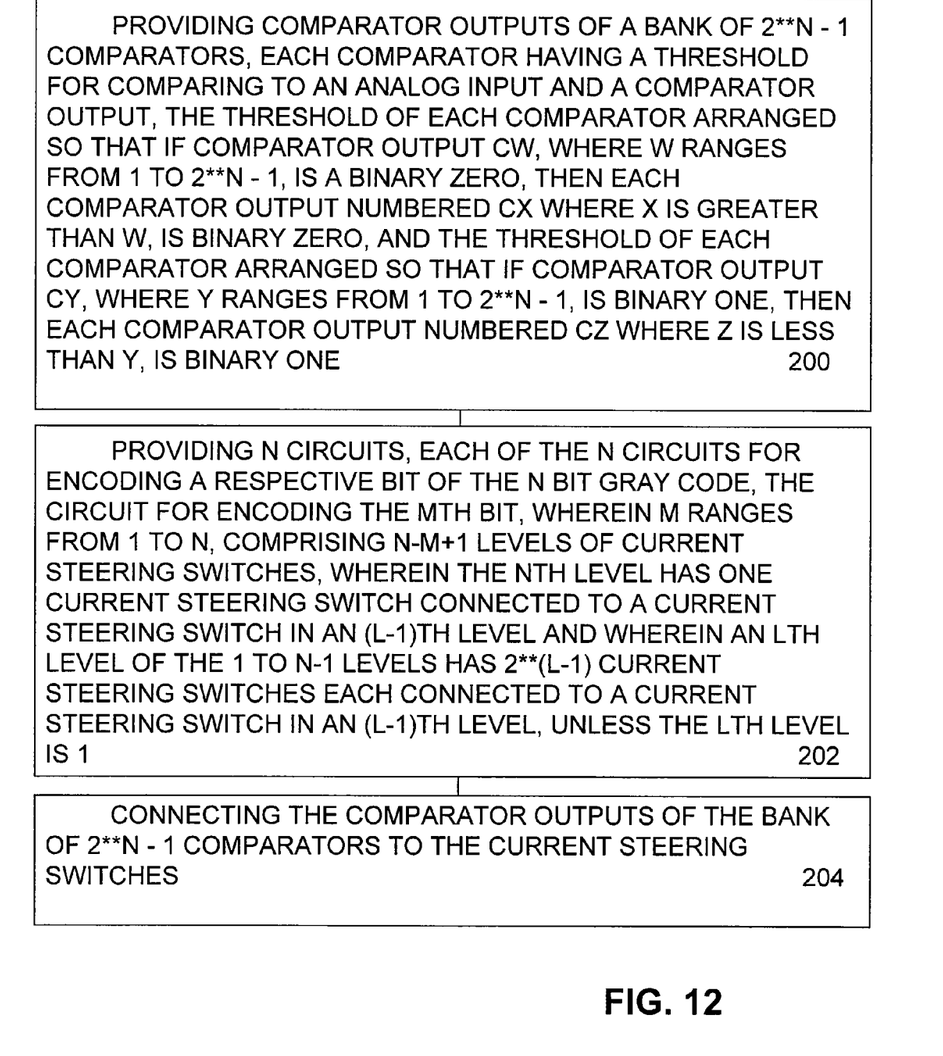

FIGS. 11 and 12 show methods for encoding comparator outputs into a binary code and a gray code, respectively.

Encoding for a binary code is shown in FIG. 11 and begins with step 100. In step 100, comparator outputs of a bank of 2N−1 comparators are provided for encoding into an n bit binary code, each comparator having a threshold for comparing to an analog input and a comparator output, the threshold of each comparator selected so that if comparator output Cw, wherein w ranges from 1 to 2N−1, is a binary zero, then each comparator output numbered Cx wherein x is greater than w, is binary zero, and the threshold of each comparator selected so that if comparator output Cy, wherein y ranges from 1 to 2**N−1, is binary one, then each comparator output numbered Cz wherein z is less than y, is binary one.

In step 102 N circuits are provided, each of the N circuits for encoding a respective bit of the N bit binary code, the circuit for encoding the Mth bit, wherein M ranges from 1 to N including N−M+1 levels of current steering differential pairs, wherein an Lth level of the 1 to N−M+1 levels has 2**(L−1) current steering differential pairs each connected to a current steering differential pair in an (L−1)th level, except when the Lth level is 1.

In step 104 the comparator outputs of the bank of 2**N−1 comparators are connected to the current steering differential pairs.

By practicing this method the comparator outputs of the bank of 2**N−1 comparators are encoded into an N bit binary code.

Encoding for a Gray code is shown in FIG. 12 and begins with step 200. In step 200 comparator outputs of a bank of 2N−1 comparators for encoding into an N bit gray code are provided, each comparator having a threshold for comparing to an analog input and a comparator output, the threshold of each comparator selected so that if comparator output cw, wherein w ranges from 1 to 2N−1, is a binary zero, then each comparator output numbered Cx wherein x is greater than w, is binary zero, and the threshold of each comparator selected so that if comparator output Cy, wherein y ranges from 1 to 2**n−1, is binary one, then each comparator output numbered Cz wherein z is less than y, is binary one.

In step 202 N circuits are provided, each of the N circuits for encoding a respective bit of the N bit Gray code, the circuit for encoding the Mth bit, wherein M ranges from 1 to N, comprising N−M+1 levels of current steering differential pairs, wherein the Nth level has one current steering differential pair connected to a current steering differential pair in an (L−1)th level and wherein an Lth level of the 1 to N−1 levels has 2**(L−1) current steering differential pairs each connected to a current steering differential pair in an (L−1)th level, except when the Lth level is 1.

In step 204, the comparator outputs of the bank of 2**N−1 comparators are connected to the current steering differential pairs.

By practicing this method the comparator outputs of the bank of 2**N−1 comparators are encoded into an N bit Gray code.

As a point of comparison, a 4 bit encoding of 15 comparator outputs initially to a 4 bit Gray code and then to a 4 bit binary code, implemented in series-gated current steering circuit with three or fewer levels, requires 7 differential pairs by the methods disclosed here. Other encoders that have been used in the prior art include an encoder circuit of exclusive-or gates, which required 14 gates and 4 delays; an encoder that started by encoding a transition from all zeroes to all ones and then doing a final encoding using a 16 by 4 read-only memory (ROM), which requires 16 gates plus the ROM; and an adder tree that requires 22 gates (11 full adders) and has a total path of 5 gate delays. The new method provides a significant advantage in high-speed low-power analog to digital converter designs.

The logic approach of this invention has been illustrated with differential current mode logic, but it can just as well be implemented in any other technology appropriate for series gating such as CMOS or MESFET.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An encoder for encoding comparator outputs of a bank of $2N-1$ comparators into an N bit binary code, each comparator having a threshold for comparing to an analog input and a comparator output, the threshold of each comparator selected so that if comparator output Cw, wherein w ranges from 1 to $2N-1$, is a binary zero, then each comparator output numbered Cx wherein x is greater than w, is binary zero, and the threshold of each comparator selected so that if comparator output Cy, wherein y ranges from 1 to $2**N-1$, is binary one, then each comparator output numbered Cz wherein z is less than y, is binary one, the encoder comprising:
  N circuits, each of the N circuits for encoding an Mth bit, wherein M ranges from 1 to N, of the N bit binary code, the circuit for the Mth bit comprising:
  N−M+1 levels of current steering switches;
  wherein an Lth level of the 1 to N−M+1 levels has $2**(L-1)$ current steering switches each connected to a current steering switch in an (L−1)th level, except when the Lth level is 1;
  wherein the comparator outputs of the bank of $2**N-1$ comparators are connected to the current steering switches.

2. The encoder of claim 1 wherein the comparator outputs of odd numbered comparators are connected to the switches in the Nth level of the circuit for the $1^{st}$ bit of the N bit binary code.

3. The encoder of claim 1 wherein the comparator outputs of the comparators having a number equal to 2 times an odd number are connected to switches in the (N−1)th level of the circuit for the $1^{st}$ bit of the N bit binary code.

4. The encoder of claim 1 wherein the comparator outputs of the comparators having a number equal to 4 times an odd number are connected to the switches in the (N−2)th level of the circuit for the $1^{st}$ bit of the N bit binary code.

5. The encoder of claim 1 wherein the current steering switches on the Lth level are connected to the comparator outputs of the comparators having a number equal to $2**(N-L)$ times an odd number.

6. The encoder of claim 1 wherein the comparator outputs are differential comparator outputs and wherein each differential comparator output is connected to at least one current steering switch.

7. The encoder of claim 6 wherein when N=3 the current steering switches are connected to the comparator outputs to implement the following logic:
  for the M=$1^{st}$ bit of the N bit binary code, M1=C1*C2X*C4X+C3*C2*C4X+C5*C6X*C4+C7*C6*C4;
  for the M=$2^{nd}$ bit of the N bit binary code, M2=C2*C4X+C6*C4; and
  for the M=$3^{rd}$ bit of the N bit binary code, M3=C4;
  wherein X denotes a complement of a differential comparator output, * denotes AND, and + denotes OR.

8. The encoder of claim 1 wherein each current steering switch comprises a first and a second transistor, each having a base, a collector and an emitter;
  wherein the emitter of the first transistor is connected to the emitter of the second transistor.

9. The encoder of claim 8 wherein the Lth level of the 1 to N−M+1 levels has $2**(L-1)$ current steering switches each connected to a collector of a transistor in a current steering switches in an (L−1)th level, except when the Lth level is 1.

10. The encoder of claim 8 wherein each comparator output is connected to at least one base of a current steering switch.

11. An encoder for encoding comparator outputs of a bank of $2N-1$ comparators into an N bit gray code, each comparator having a threshold for comparing to an analog input and a comparator output, the threshold of each comparator selected so that if comparator output Cw, wherein w ranges from 1 to $2N-1$, is a binary zero, then each comparator output numbered Cx wherein x is greater than w, is binary zero, and the threshold of each comparator selected so that if comparator output Cy, wherein y ranges from 1 to $2**N-1$, is binary one, then each comparator output numbered Cz wherein z is less than y, is binary one, the encoder comprising:
  N circuits, each of the N circuits for encoding an Mth bit, wherein M ranges from 1 to N, of the N bit gray code; the circuit for the Mth bit comprising N−M+1 levels of current steering switches;

wherein the Nth level has one current steering switch connected to a current steering switch in an (L−1)th level; and wherein an Lth level of the 1 to N−1 levels has 2**(L−1) current steering switches each connected to a current steering switch in an (L−1)th level, except when the Lth level is 1;

wherein the comparator outputs of the bank of 2**N−1 comparators are connected to the current steering switches.

12. The encoder of claim 11 wherein the comparator output of the comparator numbered 1 is connected to the current steering switch in the Nth level of the circuit for the 1$^{st}$ bit of the N bit gray code.

13. The encoder of claim 11 wherein the comparator outputs of the comparators having a number equal to (2*(2k−1)+1) for k=1, 2, 3 . . . are connected to the current steering switches in the (N−1)th level of the circuit for the 1$^{st}$ bit of the N bit gray code.

14. The encoder of claim 11 wherein the comparator outputs of the comparators having a number equal to (4*(2m−1)+1) for m=1, 2, 3 . . . are connected to the current steering switches in the (N−2)th level of the circuit for the 1$^{st}$ bit of the N bit gray code.

15. The encoder of claim 11 wherein the comparator outputs of the comparators having a number equal to (8*(2n−1)+1) for n=1, 2, 3 . . . are connected to the current steering switches in the (N−3)th level of the circuit for the 1$^{st}$ bit of the N bit gray code.

16. The encoder of claim 11 wherein the comparator output of comparator numbered 2 is connected to the current steering switch in the (N−1)th level of the circuit for the 2$^{nd}$ bit of the N bit gray code.

17. The encoder of claim 11 wherein the comparator outputs of the comparators having a number equal to 2*(2$^{(S−1)}$*(2k−1)+1) for k=1, 2, 3 . . . are connected to the current steering switches in the (N−S)th level of the circuit for the 2$^{nd}$ bit of the N bit gray code, wherein S is equal to or greater than 2.

18. The encoder of claim 11 wherein the comparator outputs of the comparators are differential comparator outputs and wherein each differential comparator output is connected to at least one current steering switch.

19. The encoder of claim 11 wherein when N=4 the current steering switches are connected to the comparator outputs to implement the following logic for the M=1$^{st}$ bit of the N bit gray code:

M1=C1*C3X*C5X*C9X+C5*C7X*C9X+C9*C11X*C13X+C9*C13*C15X;

wherein X denotes a complement of a differential comparator output, * denotes AND, and + denotes OR.

20. The encoder of claim 11 wherein each current steering switch comprises a first and a second transistor, each having a base, a collector and an emitter;

wherein the emitter of the first transistor is connected to the emitter of the second transistor.

21. The encoder of claim 20 wherein each comparator output is connected to at least one base of a current steering switch.

22. A method of encoding comparator output of an analog to digital converter into an N bit binary code, the method comprising:

providing comparator outputs of a bank of 2N−1 comparators, each comparator having a threshold for comparing to an analog input and a comparator output, the threshold of each comparator selected so that if comparator output Cw, wherein w ranges from 1 to 2N−1, is a binary zero, then each comparator output numbered Cx wherein x is greater than w, is binary zero, and the threshold of each comparator selected so that if comparator output Cy, wherein y ranges from 1 to 2**N−1, is binary one, then each comparator output numbered Cz wherein z is less than y, is binary one;

providing N circuits, each of the N circuits for encoding a respective bit of the N bit binary code, the circuit for encoding the Mth bit, wherein M ranges from 1 to N, comprising:

N−M+1 levels of current steering switches;

wherein an Lth level of the 1 to N−M+1 levels has 2(L−1) current steering switches each connected to a current steering switch in an (L−1)th level, except when the Lth level is 1; and connecting the comparator outputs of the bank of 2N−1 comparators to the current steering switches.

23. A method of encoding comparator output of an analog to digital converter into an N bit Gray code, the method comprising:

providing comparator outputs of a bank of 2N−1 comparators, each comparator having a threshold for comparing to an analog input and a comparator output, the threshold of each comparator selected so that if comparator output Cw, wherein w ranges from 1 to 2N−1, is a binary zero, then each comparator output numbered Cx wherein x is greater than w, is binary zero, and the threshold of each comparator selected so that if comparator output Cy, wherein y ranges from 1 to 2**N−1, is binary one, then each comparator output numbered Cz wherein z is less than y, is binary one;

providing N circuits, each of the N circuits for encoding a respective bit of the N bit Gray code, the circuit for encoding the Mth bit, wherein M ranges from 1 to N, comprising N−M+1 levels of current steering switches;

wherein the Nth level has one current steering switch connected to a current steering switch in an (L−1)th level; and wherein an Lth level of the 1 to N−1 levels has 2(L−1) current steering switches each connected to a current steering switch in an (L−1)th level, except when the Lth level is 1; and connecting the comparator outputs of the bank of 2N−1 comparators to the current steering switches.

* * * * *